United States Patent

Matsuo et al.

[11] Patent Number: 5,315,543
[45] Date of Patent: May 24, 1994

[54] SEMICONDUCTOR MEMORY DEVICE AND A MANUFACTURING METHOD THEREOF

[75] Inventors: Naoto Matsuo, Ibaraki; Hisashi Ogawa, Katano; Yoshiro Nakata, Ikoma; Shozo Okada, Kobe, all of Japan

[73] Assignee: Matsushita Electric Industrial Co., Ltd., Kadoma, Japan

[21] Appl. No.: 882,064

[22] Filed: May 12, 1992

[30] Foreign Application Priority Data

May 13, 1991 [JP] Japan .................................. 3-107621

[51] Int. Cl.$^5$ .............................................. G11C 13/00
[52] U.S. Cl. ...................................... 365/149; 365/51; 365/182; 257/301; 257/302
[58] Field of Search .................. 365/149, 51, 189.01, 365/182; 257/68, 69, 71, 296, 301, 302, 303, 304, 305

[56] References Cited

U.S. PATENT DOCUMENTS 4,803,535  2/1989  Taguchi .............................. 365/149
5,047,815  9/1991  Yasuhira et al. ..................... 257/303

OTHER PUBLICATIONS

T. Kaga et al., *IEDM 87*, pp. 332-335, "A 4.2 μm$^2$ Half-Vcc, Sheath-Plate Cap. DRAM Cell Self-Aligned Buried Plate-Wiring", May 1987.

*Primary Examiner*—Eugene R. LaRoche
*Assistant Examiner*—Huan Hoang
*Attorney, Agent, or Firm*—Ratner & Prestia

[57] ABSTRACT

A semiconductor memory device includes a single crystalline semiconductor substrate having a main surface, a plurality of active regions formed at the main surface, and an isolation region which is formed at the main surface and isolates the active regions from one another. Each of the active regions has a transistor region and a capacitor region. The capacitor region has a trench formed in the single crystalline semiconductor substrate. An inner wall of the trench is covered with an insulating layer. At least a portion of the transistor region and the insulating layer are both covered with a semiconductor layer. A portion of the semiconductor layer which covers at least the portion of the transistor region is an epitaxial layer. A portion of the semiconductor layer which covers the insulating layer is a polycrystalline layer, which functions as a storage node of a capacitor. A semiconductor memory device is manufactured by forming an isolation region for isolating a plurality of active regions from one another at a main surface of a single crystalline semiconductor substrate, forming a trench in at least a portion of the active regions of the single crystalline semiconductor substrate, covering an inner wall of the trench with an insulating layer, forming a polysilicon seed film on the insulating layer, and growing a single crystalline silicon layer and a polysilicon layer respectively on an exposed portion of the top surface of the single crystalline semiconductor substrate and on the polysilicon seed film simultaneously and selectively.

5 Claims, 10 Drawing Sheets

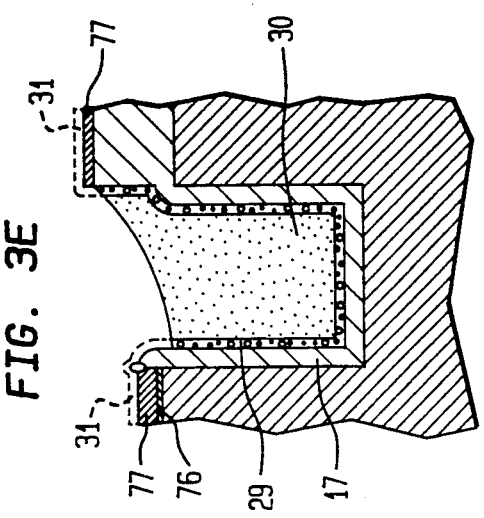
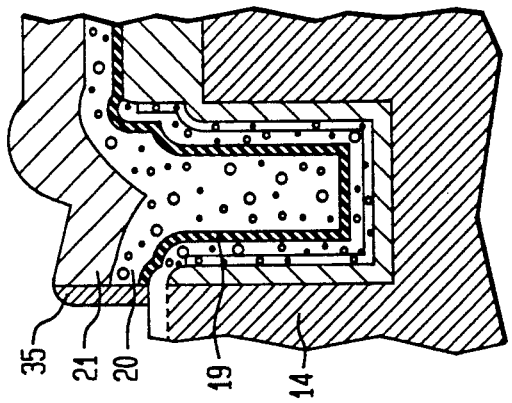
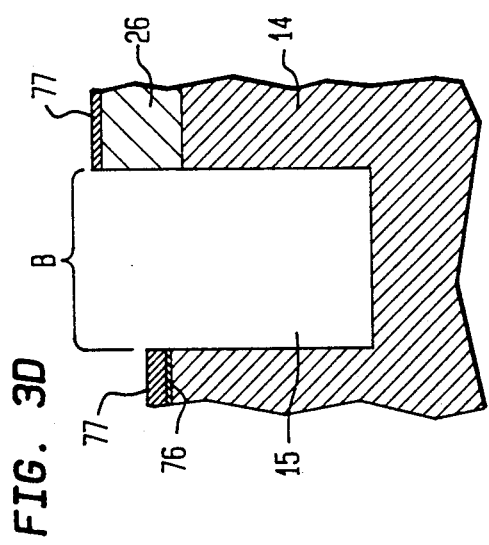
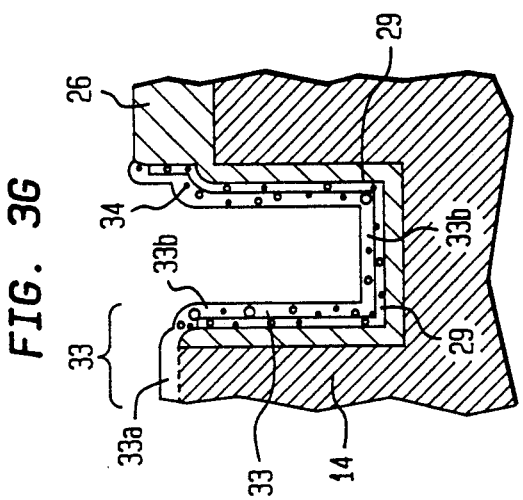
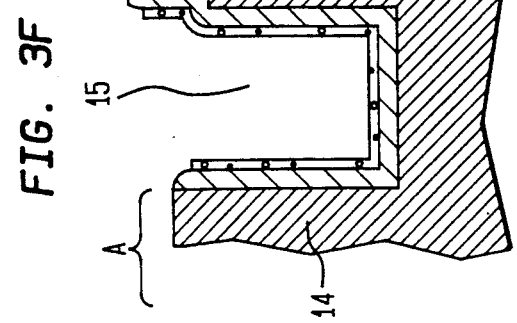

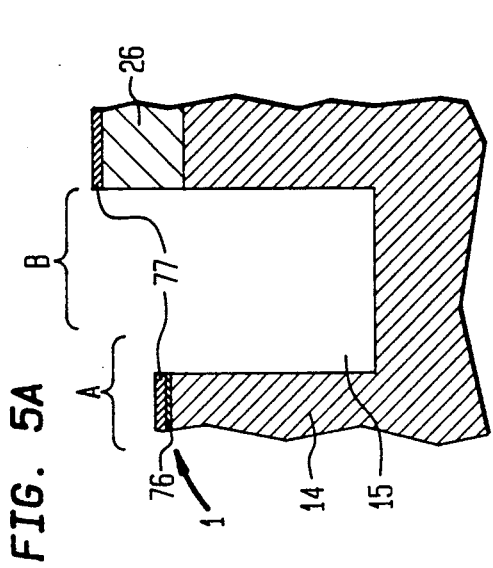
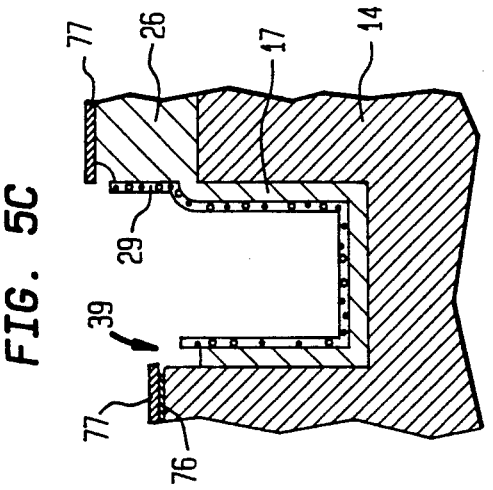
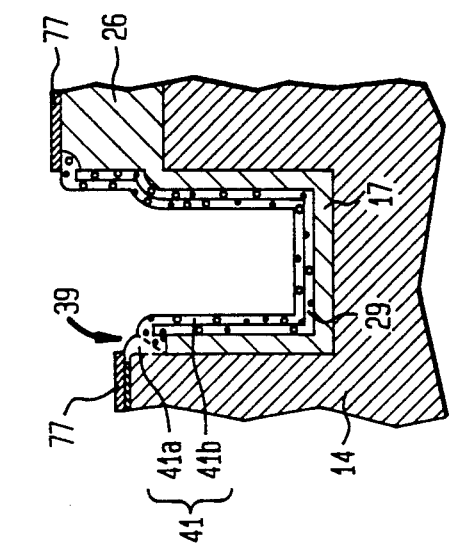
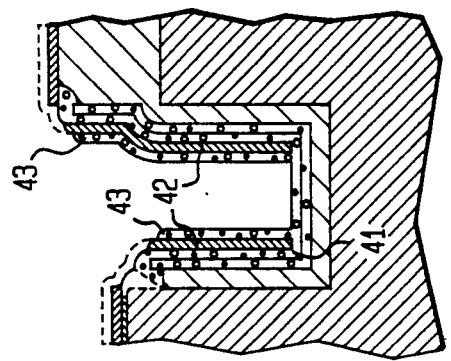

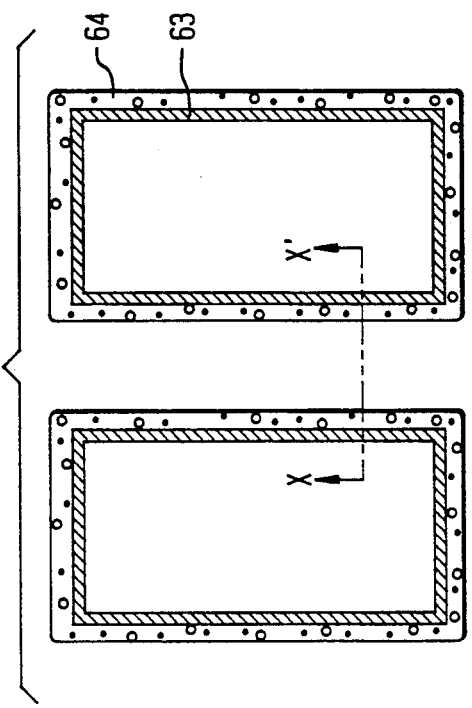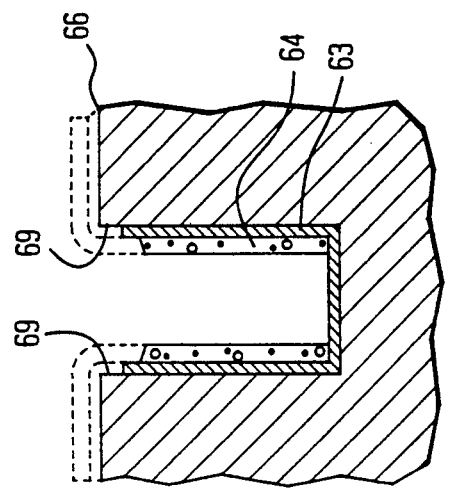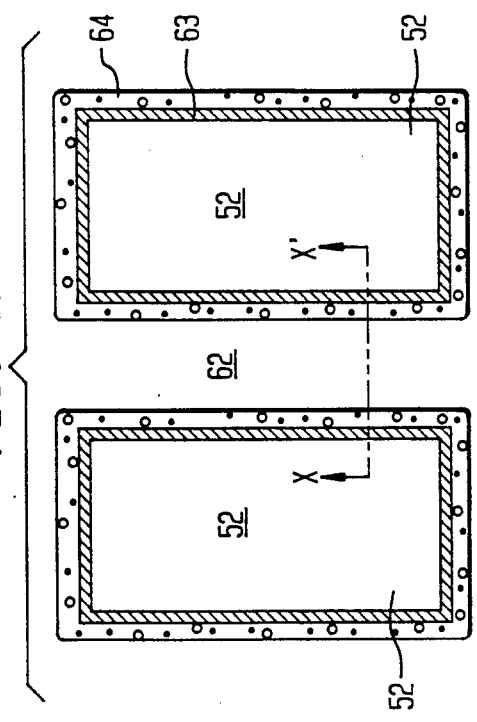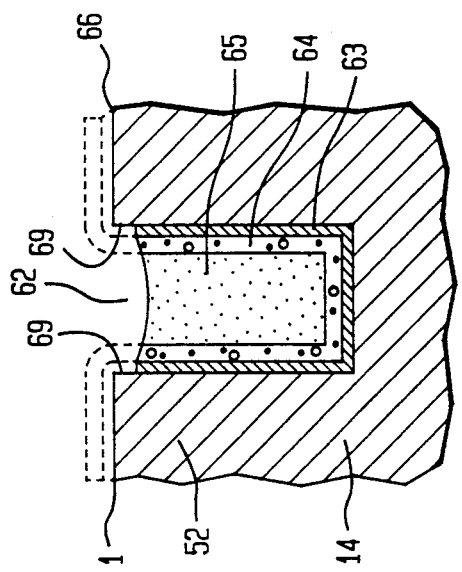

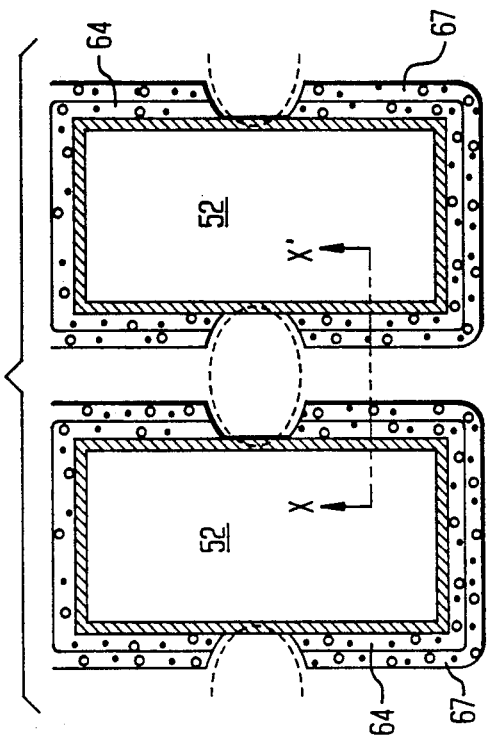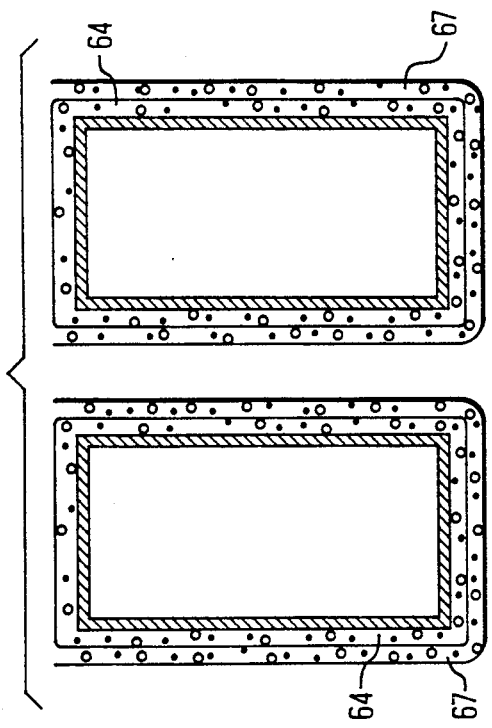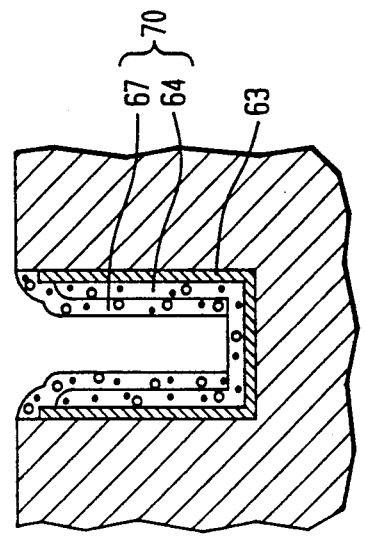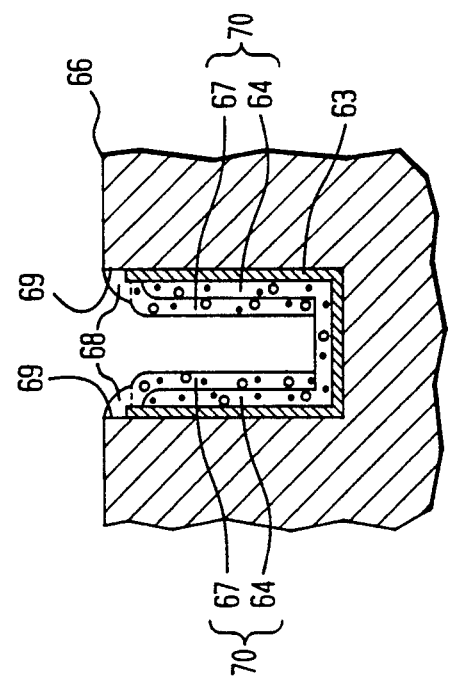

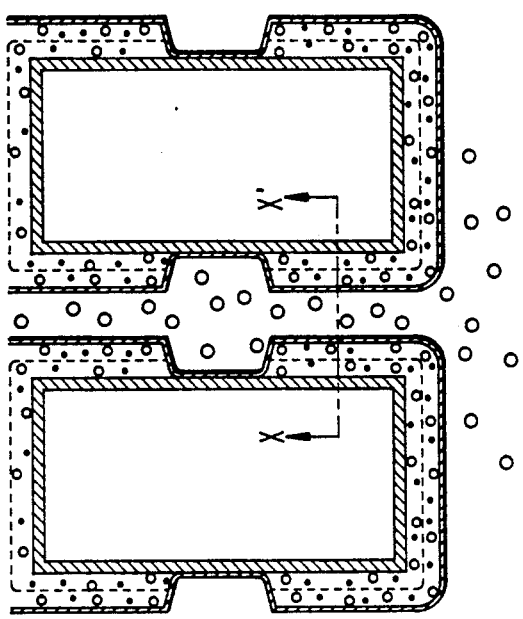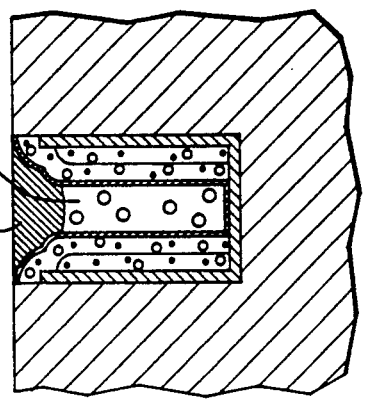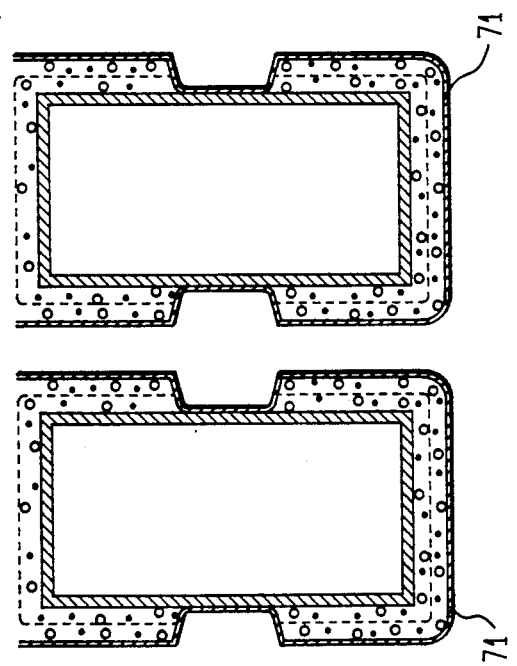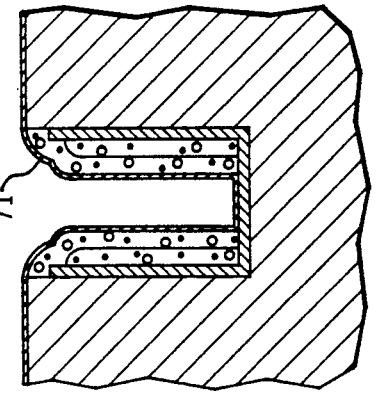

SEMICONDUCTOR MEMORY DEVICE AND A MANUFACTURING METHOD THEREOF

BACKGROUND OF THE INVENTION

1. Field of the Invention:

The present invention relates to a semiconductor memory device and a manufacturing method thereof. More particularly, the present invention relates to a semiconductor memory device including a plurality of memory cells, each having a switching transistor and a capacitor connected thereto and a manufacturing method thereof.

2. Description of the Prior Art:

For reducing the size of a memory cell of a semiconductor memory device, a construction in which an electrode (storage node) of a capacitor is formed in a trench has been proposed. For example, a stacked trench semiconductor memory cell is disclosed in Technical Digest of 1987 IEDM, pp. 332-335.

A manufacturing method of a conventional stacked trench DRAM will be described with reference to FIGS. 9A through 9J. FIGS. 9A through 9E illustrate a cross section of a memory cell in each manufacturing step of the conventional stacked trench DRAM. FIGS. 9F through 9J illustrate a cross section of a plate potential applying section disposed in a peripheral region of a memory cell array in each manufacturing step. FIGS. 9A through 9E and FIGS. 9F through 9J respectively show the same steps.

As is shown in FIGS. 9A and 9F, a trench is formed in a portion of an active region of a semiconductor substrate 114 which has an oxide film 11 and a nitride film 10 on a surface thereof, and then, an oxide film sheath 13 is selectively formed on an inner wall of the trench. As is shown in FIG. 9B, a portion of the trench which is located in the memory cell is covered with a resist 3. The oxide film sheath 13 in a portion of the trench which is located in a peripheral region of the memory cell array and thus is not covered with the resist 3 is removed as is shown in FIG. 9G, thereby exposing a portion of the semiconductor substrate 114. Then, an n-type impurity is diffused over the exposed portion of the semiconductor substrate 114, thereby forming an n-type impurity diffusion layer 7 in the semiconductor substrate 114 as is shown in FIGS. 9C and 9H.

After a polysilicon film 4 is formed on the inner wall of the trench, a capacitive oxide film 5 is formed on the polysilicon film 4, and the trench is filled with a resist 6. Portions of the capacitive oxide film 5, the polysilicon film 4 and the resist 6 which are located outside the trench are etched away. In this way, the capacitive oxide film 5, the polysilicon film 4 and the resist 6 are left only in the trench as is shown in FIGS. 9C and 9H.

Then, another polysilicon film 8 is formed so as to fill the trench. A portion of the polysilicon film 8 which is located outside the trench is removed using an etchback technique, thereby leaving the polysilicon film 8 only on the capacitive oxide film 5 as is shown in FIGS. 9D and 9I. Then, a lithography technique is used to form a resist 9 having openings at specified positions and then to etch away a portion of the oxide film sheath 13 which is located on a contact area of the inner wall of the trench. In this way, a side wall window is formed in the oxide film sheath 13. As is shown in FIG. 9I, the trench located in a peripheral region of the memory cell array is covered with the resist 9.

The polysilicon film 8 located in the trench of the memory cell functions as a storage node 81, while the polysilicon film 8 located in the trench of the plate potential applying section functions as a plate potential applying electrode 82.

After the nitride film 10 is removed, still another polysilicon film is deposited on the entire surface of the semiconductor substrate 114. The polysilicon film deposited on the semiconductor substrate 114 is thermally oxidized, thereby forming an oxide film 12 on the storage node 81 and the plate potential applying electrode 82. Then, the oxide film 11 is removed from an active region, thereby forming a source and a drain (not shown) of a transistor in the active region. The source is electrically connected to the storage node 81 through the side wall window.

The n-type impurity diffusion layer 7 of the plate potential applying section in the peripheral region of the memory cell array is connected to the n-type impurity diffusion layer 7 of the memory cell, and the n-type impurity diffusion layer 7 is in direct contact with the plate potential applying electrode 82. Accordingly, the plate potential is supplied from the plate potential applying electrode 82 to the polysilicon film 4 of the memory cell, the polysilicon film 4 functioning as a plate electrode. Therefore, when a voltage is generated between the polysilicon film 4 functioning as a cell plate and the storage node 81, the capacitive oxide film 5 has a charge stored on both side surfaces thereof.

In such a conventional stacked trench semiconductor memory device, further reduction of the size thereof accompanying the improvement of the memory capacity results in difficulty in the alignment which is conducted by the use of the lithography technique for forming the side wall window (FIG. 9D). Inferior alignment will significantly reduce the production yield. Moreover, the contact resistance is increased due to a native oxide film existing on the side wall contact.

SUMMARY OF THE INVENTION

In the semiconductor memory device of this invention including a single crystalline semiconductor substrate having a main surface, a plurality of active regions formed at the main surface, and an isolation region which is formed at the main surface and isolates the active regions from one another, each of the active regions has a transistor region and a capacitor region; the capacitor region has a trench formed in the single crystalline semiconductor substrate, an inner wall of the trench being covered with an insulating layer; at least a portion of the transistor region and the insulating layer are both covered with a semiconductor layer; a portion of the semiconductor layer, the portion covering at least the portion of the transistor region is an epitaxial layer; and a portion of the semiconductor layer, the portion covering the insulating layer, is a polycrystalline layer, which functions as a storage node of a capacitor.

In one embodiment of the invention, the polycrystalline layer includes a first polycrystalline semiconductor layer formed on the insulating layer and a second semiconductor layer covering the first semiconductor layer, and the second semiconductor layer is a portion of another semiconductor layer which includes the epitaxial layer.

In another embodiment of the invention, the portion of the semiconductor layer which covers at least the portion of the transistor region has a channel of a transistor.

In still another embodiment of the invention, the polycrystalline layer has at least two cylinders in the trench.

In the semiconductor memory device of the present invention including a single crystalline semiconductor substrate having a main surface, a plurality of island regions formed at the main surface, and a trench region which is formed in the main surface and isolates the island regions from one another, each of the island regions has a side wall, a portion of which is exposed in a portion of the trench region, and a portion of the side wall which is not exposed is covered with an insulating layer, and each of the island regions has at least one transistor at a top surface thereof; a portion of the side wall of each island region and the insulating layer are both covered with a semiconductor layer; a portion of the semiconductor layer, the portion covering the portion of the side wall of each island region, is an epitaxial layer; and a portion of the semiconductor layer, the portion covering the insulating layer is a polycrystalline layer, which functions as a storage node of a capacitor.

A method for manufacturing a semiconductor memory device of the present invention includes the steps of forming an isolation region for isolating a plurality of active regions from one another at a main surface of a single crystalline semiconductor substrate; forming a trench in at least a portion of the active regions of the single crystalline semiconductor substrate; covering an inner wall of the trench with an insulating layer; forming a polysilicon seed film on the insulating layer; and simultaneously and selectively growing a single crystalline silicon layer on an exposed portion of the top surface of the single crystalline semiconductor substrate and a polysilicon layer on the polysilicon seed film.

In one embodiment of the invention, the method for manufacturing a semiconductor memory device further includes the step of forming an amorphous film at least on each of the active regions after the isolation region is formed; and the step of removing the amorphous film from the active region to expose a top surface of the active region after the polysilicon seed film is formed.

In another embodiment of the invention, the method for manufacturing a semiconductor memory device further includes the step of forming a transistor at the single crystalline silicon layer.

A method for manufacturing a semiconductor memory device of the present invention includes the steps of forming an isolation region for separating a plurality of active regions from one another at a main surface of a single crystalline semiconductor substrate; forming an amorphous film at least on each of the active regions; forming a trench in at least a portion of the active regions of the single crystalline semiconductor substrate; covering an inner wall of the trench with an insulating layer; forming a polysilicon seed film on the insulating layer; removing a portion of the insulating layer to expose a portion of the active region; and simultaneously and selectively growing a single crystalline silicon layer on the exposed portion of the active region and a polysilicon layer on the polysilicon seed film.

In one embodiment of the invention, the method for manufacturing a semiconductor memory device further includes the steps of forming a storage node having a multiple-layered cylinder structure in the trench after the single crystalline silicon layer and the polysilicon layer are formed; removing the amorphous film from the active region to expose a top surface of the active region; and forming a transistor at the exposed portion of the top surface of the active region.

A method for manufacturing a semiconductor memory device of the present invention includes the steps of forming a plurality of island regions and a trench region for isolating the island regions from one another at a single crystalline semiconductor substrate, the island regions each having a side wall; forming an insulating layer on the side wall and a bottom surface of the trench region; forming a polysilicon seed film on the insulating layer; and simultaneously and selectively growing a single crystalline silicon layer on an exposed portion of each island region and a polysilicon layer on the polysilicon seed film.

In one embodiment of the invention, the method for manufacturing a semiconductor memory device further includes the step of forming an amorphous film on a main surface of the single crystalline semiconductor substrate which includes at least a plurality of active regions before the island regions and the trench region are formed; and the step of removing the amorphous film from the island regions to expose a top surface of the island region before the polysilicon seed film is formed.

A method for manufacturing a semiconductor memory device of the present invention includes the steps of forming a plurality of island regions each having a side wall and a trench region for separating the island regions from one another at a single crystalline semiconductor substrate; forming an insulating layer on the side wall of each island region and a bottom surface of the trench; forming a polysilicon seed film on the insulating layer; removing a portion of the insulating layer to expose a portion of the island region; and simultaneously and selectively growing a single crystalline silicon layer on an exposed portion of island region and a polysilicon layer on the polysilicon seed film.

Thus, the invention described herein makes possible the objectives of (1) providing a semiconductor memory device which has a low contact resistance between a source of a transistor and a storage node of a capacitor and which realizes a high production yield and (2) providing a manufacturing method of such a semiconductor memory device.

BRIEF DESCRIPTION OF THE DRAWINGS

This invention may be better understood and its numerous objects and advantages will become apparent to those skilled in art by reference to the accompanying drawings as follows:

FIGS. 3A through 3H are cross sectional views illustrating a method for manufacturing the semiconductor memory device shown in FIG. 1.

FIGS. 5A through 5F are cross sectional views illustrating a method for manufacturing the semiconductor memory device shown in FIGS. 4A and 4B.

FIGS. 6A through 6G are plan views illustrating a method for manufacturing a semiconductor memory device as a third example according to the present invention.

FIGS. 7A through 7F are respectively vertical cross sectional views taken along line X—X' of FIGS. 6A through 6F.

DETAILED DESCRIPTION OF THE PREFERRED EMBODIMENTS

Figure 1:
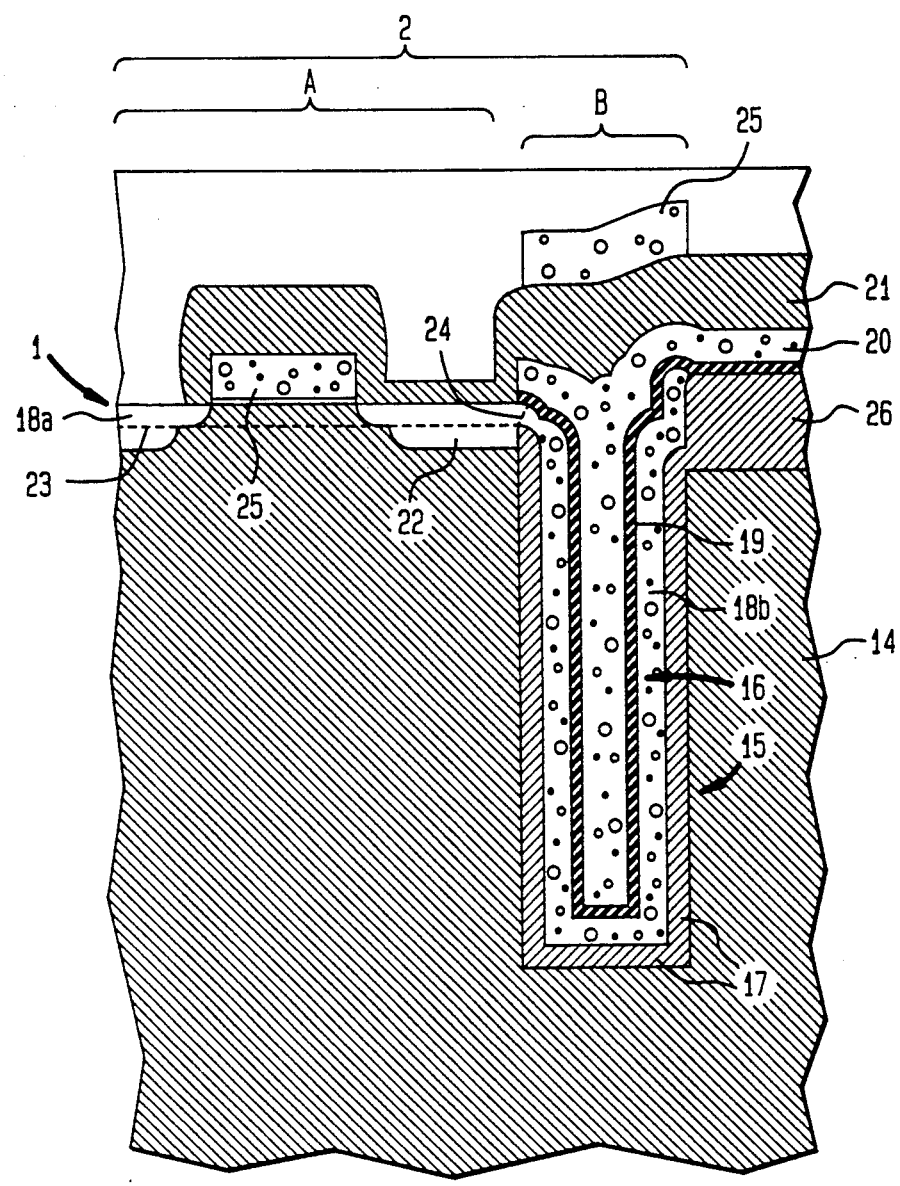
FIG. 1 is a cross sectional view of a semiconductor memory device as a first example according to the present invention.

The present invention will be described by way of illustrating embodiments with reference to the accompanying drawings.

EXAMPLE 1

A construction of a semiconductor memory device as a first example according to the present invention will be described with reference to FIGS. 1 and 2. The semiconductor memory device includes a single crystalline semiconductor substrate 14 having a main surface 1, a plurality of active regions 2 (only a portion of one active region 2 is shown in FIG. 1 for simplicity) and an isolation region 26 for isolating the active regions 2 from one another.

As shown in FIG. 1, each active region 2 includes a transistor region A and a capacitor region B. The capacitor region B has a hole-like trench 15. The inner wall of the trench 15 is covered with an insulating layer 17 which is formed by selectively oxidizing the inner wall of the trench 15. The main surface of the transistor region A and the insulating layer 17 are both covered with a semiconductor layer 18. A portion 18b of the semiconductor layer 18 which covers the insulating layer 17 functions as a storage node of a capacitor. (Hereinafter, the portion 18b will be referred to as the storage node 18b.)

A portion 18a of the semiconductor layer 18 which covers the transistor region A is an epitaxial layer, while the portion 18b which covers the insulating layer 17 is a polycrystalline layer. As will be described later, the polycrystalline layer includes a first polycrystalline semiconductor layer 29 (FIG. 3G) formed on the insulating layer 17 and a second polycrystalline semiconductor layer 33b (FIG. 3G) covering the first polycrystalline semiconductor layer 29. The second polycrystalline semiconductor layer 33b is a portion of a grown semiconductor film 33 including a single crystalline semiconductor layer 33a (shown as the portion 18a in FIG. 1).

As is shown in FIG. 1, a transistor of the semiconductor memory device of the first example includes a source 22 and a drain 23 both formed in the portion 18a and the semiconductor substrate 14, a gate insulating film formed on the portion 18a, and a gate electrode (word line) 25 formed on the gate insulating film. The channel region of the transistor is formed in the portion 18a.

As is shown in FIG. 1, the capacitor of the semiconductor memory device of the first example includes the storage node 18b, a capacitive insulating film 19 formed on the storage node 18b and a plate electrode 20 formed on the capacitive insulating film 19. The plate electrode 20 is covered with an insulating film 21.

In the first example, the capacitive insulating film 19 is made of an oxide-nitride-oxide (ONO) film. The storage node 18b and the source 22 have no native oxide film therebetween. In other words, since a virtual interface between the storage node 18b and the source 22 is in the grown semiconductor film 33 (FIG. 3G), the electric connection between the storage node 18b and the source 22 is satisfactory.

Figure 2:
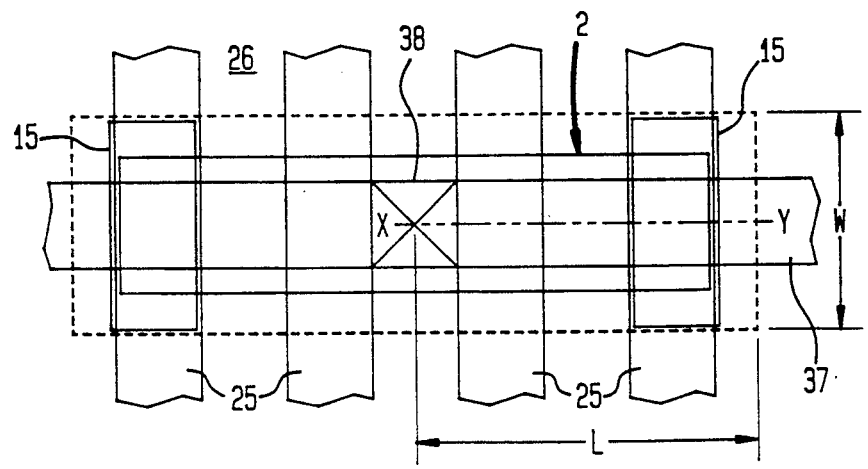
FIG. 2 is a plan view of a semiconductor memory device shown in FIG. 1.

FIG. 2 is a plan view of the semiconductor memory device. FIG. 1 is taken along line X-Y of FIG. 2. In FIG. 2, a memory cell indicated by a broken line has the active region 2, and two end portions of the active region 2 each has one trench 15. A bit line 37 crosses the gate electrodes (word lines) 25. The bit line 37 is connected to the drain in a contact region 38, the drain being common to two transistors. An area indicated by L×W is a memory cell.

Table 1 shows various types of semiconductor memory devices having the construction of FIG. 1 and various dimensions and capacitances of the capacitor thereof.

TABLE 1

|  | 64 to 256 Mbit DRAM | 256 Mbit to 1 Gbit DRAM |
| --- | --- | --- |
| L ($\mu$m) | 1.2 | 1.0 |
| W ($\mu$m) | 0.8 | 0.4 |
| Minimum design size ($\mu$m) | 0.3 | 0.25 |
| Area ($\mu$m$^2$) | 0.96 | 0.4 |
| Depth of trench ($\mu$m) | 4.0 | 3.0 |
| Thickness of ONO film (nm) | 5.0 | 5.0 |
| Thickness of SiO$_2$ film (nm) | 50 | 40 |
| Thickness of node (nm) | 40 | 30 |
| Capacitance $C_S$ (fF) | 49 | 20 |

In the case of a DRAM having a capacity in the range of 64 through 256 megabits, where the minimum design size is 0.3 $\mu$m, the typical size of the memory cell is 1.2 $\mu$m×0.8 $\mu$m. When a trench having a depth of 4 $\mu$m was formed in such a memory cell, a trench capacitor having a capacitance of 49 fF was obtained. In the case of a DRAM having a capacity in the range of 256 megabits through 1 gigabit, where the minimum design size is 0.25 $\mu$m, the typical size of the memory cell is 1.0 $\mu$m×0.4 $\mu$m. When a trench having a depth of 3 $\mu$m was formed in such a memory cell, a trench capacitor having a capacitance of 20 fF was obtained.

A method for manufacturing the semiconductor memory device illustrated in FIG. 1 will be described with reference to FIGS. 3A through 3E.

Figure 3A:
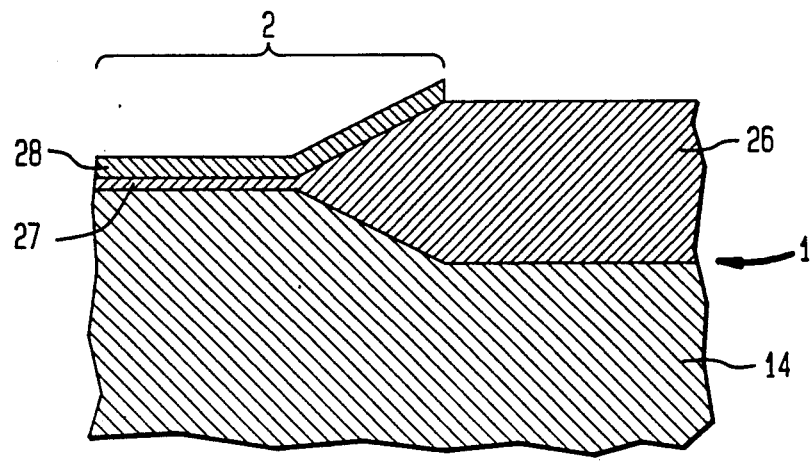
Figure 3B:
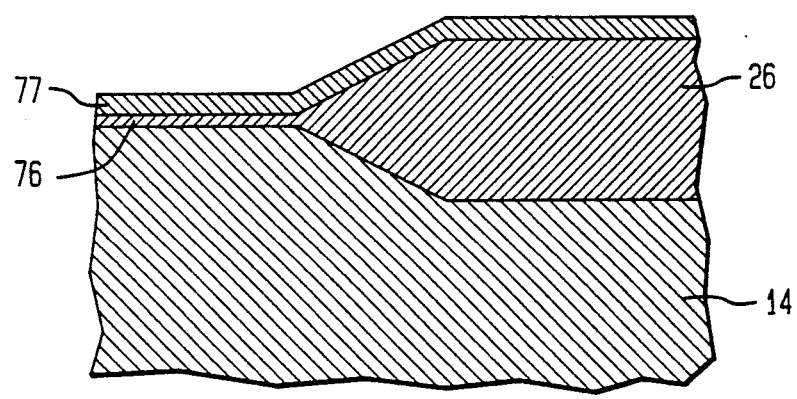
Figure 3C:
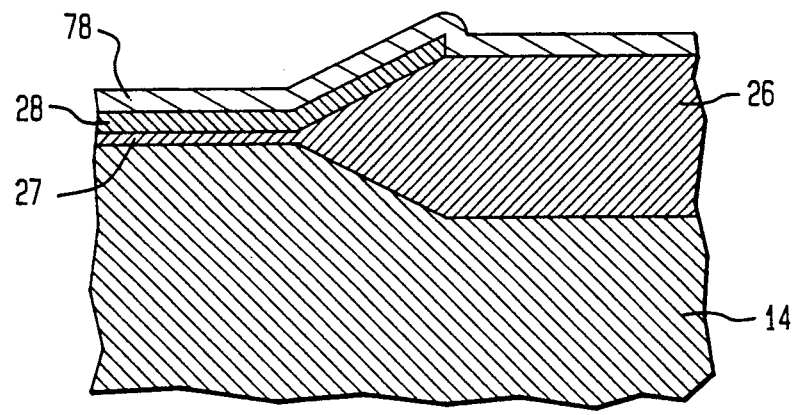

As is shown in FIG. 3A, an isolation region 26 (a LOCOS film; thickness: 300 nm) is formed on the main surface 1 of the single crystalline semiconductor substrate 14 by the known LOCOS process. Namely, an oxide film 27 and a nitride film 28 for covering the active regions 2 are formed, and then a portion of the main surface 1 which is not covered with the nitride film 28 is selectively oxidized. Thereafter, the oxide film 27 and the nitride film 28 are removed. As is shown in FIG. 3B, an oxide film 76 (thickness: 10 nm) and a nitride film 77 (thickness: 100 nm) are formed on the single crystalline semiconductor substrate 14. Alternatively, without removing the nitride film 28, a nitride film 78 may be formed so as to cover the nitride film 28 as is shown in FIG. 3C. The oxide film 76 and the nitride film 77 function together as an etching stop layer in an etching process which will be performed later.

The active regions 2 thus formed each include the transistor region A and the capacitor region B shown in FIG. 1.

Then, as is shown in FIG. 3D, the hole-like trench 15 having a depth of 3 to 4 μm is formed in the capacitor region B of the single crystalline semiconductor substrate 14 by the use of the known lithography and dry etching techniques. By the dry etching process, a portion of the single crystalline semiconductor substrate 14 is exposed in the trench 15. Thereafter, the exposed portion in the trench 15 is selectively oxidized by a thermally oxidizing process. As a result, the insulating layer 17 (thickness: approximately 50 nm) formed of a thermally oxidized film is formed on the inner wall of the trench 15 as is shown in FIG. 3E.

Next, the phosphorus doped first polycrystalline semiconductor layer 29 (thickness: approximately 20 nm) is deposited on the nitride film 77 and the insulating layer 17. The first polycrystalline semiconductor layer 29 includes phosphorus of 1 to $2 \times 10^{20}$ cm$^{-3}$. The trench 15 is filled with a resist 30 having a substantially smooth top surface, and an etchback technique is applied to a top portion of the resist 30, thereby removing a portion 31 of the first polycrystalline semiconductor layer 29 which is located outside of the trench 15 as is shown in FIG. 3E. Since the nitride film 77 and the oxide film 76 function together as the etching stop layer in the etchback process, the top surface of the active region 2 is not etched.

As is shown in FIG. 3F, the resist 30 remaining in the trench 15, the oxide film 76 and the nitride film 77 are removed, thereby exposing the transistor region A of the single crystalline semiconductor substrate 14. The resist 30, the oxide film 76 and the nitride film 77 are respectively removed by the use of an $O_2$ plasma, a solution of phosphoric acid and a solution on HF.

As is shown in FIG. 3G, the semiconductor film 33 (thickness: 30 nm) is selectively grown on the exposed transistor region A and on the first polycrystalline semiconductor layer 29 in the trench 15 by a low pressure chemical vapor phase deposition (LPCVD) method. The grown semiconductor film 33 includes the single crystalline semiconductor layer 33a grown on the transistor region A and the second polycrystalline semiconductor layer 33b grown on the first polycrystalline semiconductor layer 29. The semiconductor film 33 is grown by putting a silicon layer into contact with a mixed gas of $SiCl_2$, HCl and $H_2$ (40 torr) at a temperature in the range of 800° to 850° C. Under such conditions, an epitaxial layer is grown on a single crystalline silicon layer, and a polycrystalline layer is grown on a polysilicon layer. In the case when an amorphous layer such as a LOCOS film is used as a base layer, no silicon layer is grown. In the first example, since the isolation region 26 formed by the LOCOS process, the transistor region A and the first polycrystalline semiconductor layer 29 are exposed immediately before the semiconductor film 33 is grown, the semiconductor film 33 is grown in islands only on the active region 2 in self-alignment with the active region. 2. As is mentioned above, the semiconductor film 33 includes the single crystalline semiconductor layer 33a and the second polycrystalline semiconductor layer 33b which have been grown together. The single crystalline semiconductor layer 33a having excellent electric characteristics will have a channel of the transistor formed thereon as will be described later, and the second polycrystalline semiconductor layer 33b functions as the storage node of the capacitor together with the first polycrystalline semiconductor layer 29. The grown semiconductor film 33 in the first example is non doped, and so includes impurities functioning as donors or acceptors only in a low density.

As is shown in FIG. 3H, a capacitive insulating film 19 formed of an ONO film (thickness: 2 to 5 nm in terms of $SiO_2$) is formed on the grown semiconductor film 33, thereafter a polysilicon film (P density: as high as 1 to $2 \times 10^{20}$ cm$^{-3}$; thickness: 200 nm) to be the plate electrode 20 is deposited on the capacitive insulating film 19. On the polysilicon film, an oxide film (to function as the insulating film 21) including a CVD-oxide layer (lower layer) with no impurity and a BPSG layer (upper layer) with impurities is deposited. After the oxide film (21) and the polysilicon film (20) are patterned to form a plurality of plate electrodes 20, a side wall 35 is formed on a side surface of each plate electrode 20 in order to electrically insulate the plate electrodes 20 from one another.

Then, a MOS transistor shown in FIG. 1 is formed on the transistor region A by the use of the ordinary transistor production process. The source 22 and the drain 23 are formed by implanting As ions. After the ion implantation, the source 22 and the drain 23 are annealed to activate the impurities. By the annealing process, phosphorus in the first polycrystalline semiconductor layer 29 including a high density of phosphorus is diffused to the second polycrystalline semiconductor layer 33b including a low density of phosphorus. Further by the annealing process, As in the source 22 is diffused from the single crystalline semiconductor layer 33a to the second polycrystalline semiconductor layer 33b, thereby electrically connecting the source 22 and the storage node 18b.

According to the first example of the present invention, a portion of the storage node 18b in the trench 15 (namely, the second polycrystalline semiconductor layer 33b) and the single crystalline semiconductor layer 33a are formed by an LPCVD method, simultaneously and as one continuous layer in self-alignment with the active region. Accordingly, the step of forming a side wall contact for connecting the source of the transistor and the storage node is eliminated. As a result, the reduction of the production yield is prevented.

EXAMPLE 2

A semiconductor memory device as a second example according to the present invention will be described with reference to FIGS. 4A and 4B.

Figure 4A:
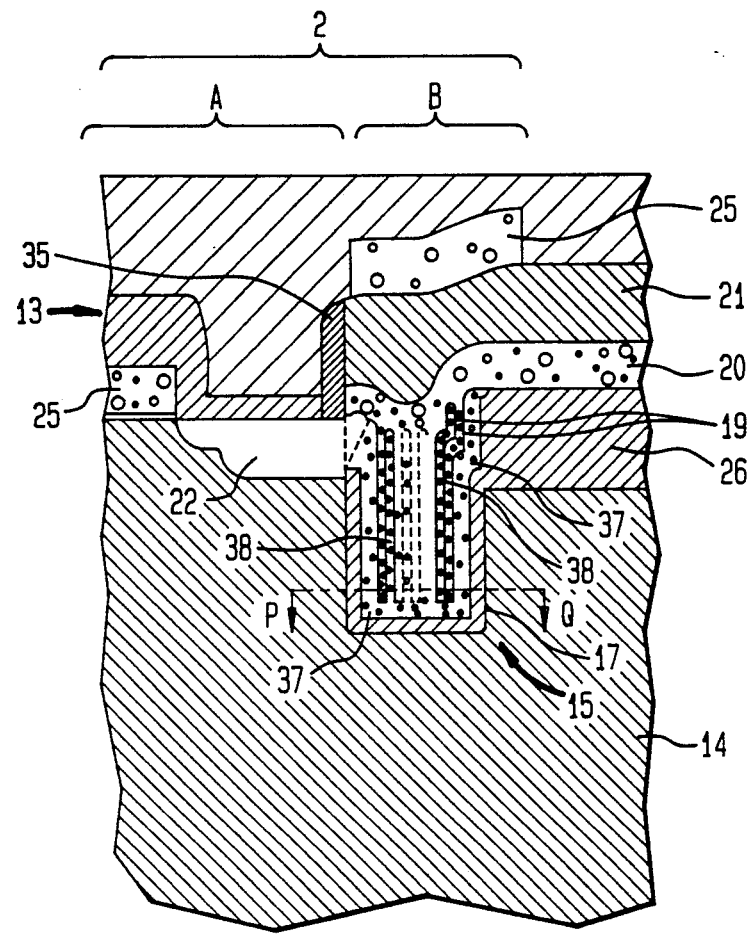
FIG. 4A is a cross sectional view of a semiconductor memory device as a second example according to the present invention.
Figure 4B:
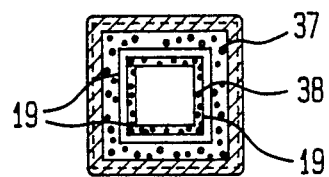
FIG. 4B is a horizontal cross sectional view thereof taken along line P-Q of FIG. 4A.

The semiconductor memory device includes a single crystalline semiconductor substrate 14 having a main surface 1, a plurality of active regions 2 (only a portion of one active region 2 is shown in FIG. 4A for simplicity) and an isolation region 26 for isolating the active regions 2 from one another.

As is shown in FIG. 4A, each active region 2 includes a transistor region A and a capacitor region B. The capacitor region B has a hole-like trench 15. The inner wall of the trench 15 is covered with an insulating layer 17 which is formed by selectively oxidizing the inner wall of the trench 15. Distinctly from the semiconductor memory device of the first example, the main surface 1 of the transistor region A is not covered with the semiconductor layer 18.

As is shown in FIG. 4A, a transistor of the semiconductor memory device of the second example includes a source 22 formed in the semiconductor substrate 14, a gate insulating film formed on the single crystalline semiconductor substrate 14, and a gate electrode (word line) 25 formed on the gate insulating film. The channel region of the transistor is formed in the single crystalline semiconductor substrate 14.

As is shown in FIG. 4A, the capacitor of the semiconductor memory device of the second example includes storage nodes 37 and 38 provided in a double cylindrical construction, a capacitive insulating film 19 formed on the storage nodes 37 and 38, and a plate electrode 20 formed on the capacitive insulating film 19. As is shown in FIG. 4B, the storage node 37 (thickness: 20 nm) is disposed outside the storage node 38 (thickness: 20 nm) having a smaller inner diameter than that of the storage node 37. Such a double cylindrical construction increases a total surface area of the storage nodes 37 and 38. In terms of the surface area, it is more desirable that a third and a fourth cylindrical storage nodes having smaller diameters than that of the storage node 38 are added.

An oxide (insulating) film 21 is formed on the plate electrode 20. The oxide film 21 includes a CVD-oxide film (thickness: 100 nm) having no impurity and a BPSG film (thickness: 200 nm). A side wall 35 formed of an oxide film is formed on a side surface of the oxide film 21.

The storage nodes 37 and 38, and the source 22 have no native oxide film therebetween. Therefore, the electric connection between the storage nodes 37 and 38, and the source 22 is satisfactory. In the case when the cell area was 0.4 $\mu m^2$, a trench capacitor having a capacitance of 38 fF was obtained.

A method for manufacturing the semiconductor memory device illustrated in FIGS. 4A and 4B will be described with reference to FIGS. 5A through 5F.

As is shown in FIG. 5A, an isolation region 26 (a LOCOS film; thickness: 300 nm), an oxide film 76 (thickness: 10 nm), and a nitride film 77 (thickness: 100 nm) are formed on the main surface 1 of the single crystalline semiconductor substrate 14 in the same manner as in the first example. Then, the hole-like trench 15 having a depth of 3 $\mu m$ is formed in the capacitor region B of the single crystalline semiconductor substrate 14 by the use of the known dry etching technique. By the dry etching process, a portion of the single crystalline semiconductor substrate 14 is exposed in the trench 15. Thereafter, the exposed portion in the trench 15 is selectively oxidized by a thermally oxidizing process. As a result, the insulating layer 17 (thickness: approximately 40 nm) formed of a thermally oxidized film is formed on the inner wall of the trench 15 as is shown in FIG. 5B.

Next, a phosphorus doped polysilicon layer 29 (thickness: approximately 10 nm; corresponding to the first polycrystalline semiconductor layer in the first example) is deposited on the nitride film 77 and the insulating layer 17. The polysilicon layer 29 includes phosphorus of 1 to $2 \times 10^{20}$ cm$^{-3}$. The trench 15 is filled with a resist 30 having a substantially smooth top surface, and an etchback technique is applied to a top portion of the resist 30, thereby removing a portion 31 of the polysilicon layer 29 which is located outside of the trench 15 as is shown in FIG. 5B. Since the nitride film 77 and the oxide film 76 function together as the etching stop layer in the etchback process, the top surface of the active region 2 is not etched.

As is shown in FIG. 5C, the resist 30 remaining in the trench 15 is removed by the use of an O$_2$ plasma. At this stage, the oxide film 76 and the nitride film 77 are not removed.

As is shown in FIG. 5D, a silicon film 41 (thickness: 30 nm) is selectively grown on the polysilicon layer 29 in the trench 15 by an LPCVD method. The silicon film 41 includes an epitaxial layer 41a grown on an end portion 39 of the transistor region A and a polycrystalline layer 41b grown on the polysilicon layer 29. The silicon film 41 is grown by putting a silicon layer into contact with a mixed gas of SiCl$_2$, HCl and H$_2$ (40 Torr) at a temperature in the range of 800° to 850° C. Under such conditions, an epitaxial layer is grown on a single crystalline silicon layer, and a polycrystalline layer is grown on a polysilicon layer. In the case when an amorphous layer such as the nitride film 77 is used as a base layer, no silicon layer is grown. In the second example, since the polysilicon layer 29 and an end portion 39 of the active region 2 are exposed immediately before the silicon film 41 is deposited, the silicon film 41 is grown only in the trench 15 in self-alignment with the trench 15. As is mentioned above, the silicon film 41 includes the single crystalline semiconductor layer (epitaxial layer 41a) and the polycrystalline semiconductor layer (polycrystalline layer 41b) which have been grown together. The silicon film 41 functions as the storage node of the capacitor together with the polysilicon layer 29. The silicon film 41 in the second example is doped, and so includes impurities functioning as donors or acceptors in a high density. Since the silicon film 41 does not function as a channel of the transistor, there is no need for the density of the impurities to be low.

Next, an oxide film (HTO film) 42 is deposited so as to cover the entire surface of the single crystalline semiconductor substrate 14, thereafter a portion of the oxide film 42 which is located outside the trench 15 is removed by the use of an etchback technique, thereby leaving the oxide film 42 only on a side wall of the silicon film 41 as is shown in FIG. 5E. After a polysilicon film 43 is deposited so as to cover the entire surface of the single crystalline semiconductor substrate 14, a portion of the polysilicon film 43 which is located outside the trench 15 is removed by the use of an etchback technique, thereby leaving the polysilicon film 43 only on the side wall of the oxide film 42. The above process is repeated to form the storage nodes in a double cylindrical construction, and thus to increase the surface area of the storage nodes.

The oxide film 42 is removed by the use of a solution of HF to form the storage nodes 37 and 38. After a capacitive insulating film 19 formed of an ONO film (thickness: 5 nm) is formed, a polysilicon film including a high density of phosphorus (P density: 1 to $2 \times 10^{20}$ cm$^{-3}$; thickness: 200 nm) is deposited to be the plate electrode 20. On the polysilicon film (20), the oxide film 21 including a CVD-oxide layer (lower layer) with no impurity and a BPSG layer (upper layer) with impurities is deposited. After the oxide film 21 and the polysilicon film (20) are patterned to form a plurality of plate electrodes 20, the side wall 35 is formed on a side surface of each plate electrode 20 in order to electrically insulate the plate electrodes 20 from one another.

The oxide film 76 and the nitride film 77 are removed to expose the transistor region A. Then, a MOS transistor shown in FIG. 4A is formed on the transistor region A by the use of the ordinary transistor production process. The source 22 and the drain 23 are formed by implanting As ions.

EXAMPLE 3

In the above-described two examples, the semiconductor memory device has a capacitor formed in a hole-like trench. A third example according to the present invention provides a semiconductor memory device having a capacitor formed so as to surround the active regions disposed in islands.

Figure 8:
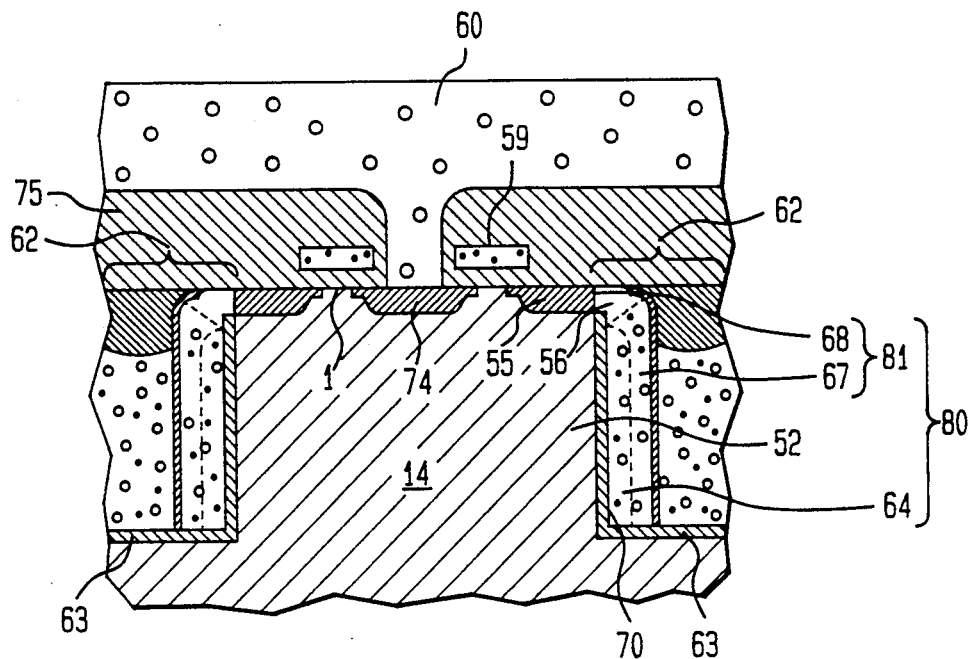
FIG. 8 is a cross sectional view taken along line Y—Y' of FIG. 6G.
Figure 9E:
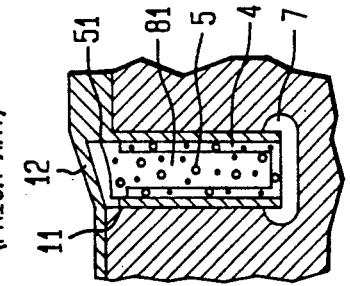
FIGS. 9A through 9J are cross sectional views illustrating a method for manufacturing a conventional semiconductor memory device.
Figure 9J:
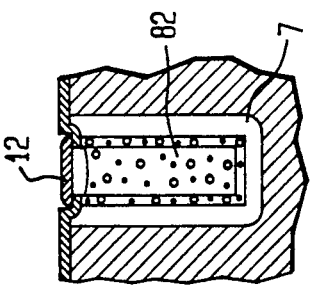
Figure 9D:
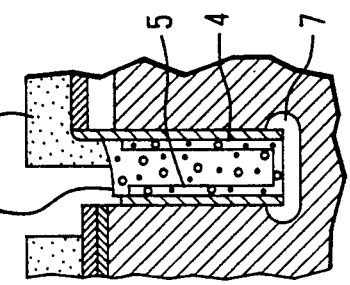
Figure 9I:
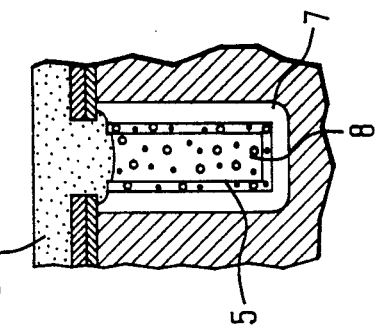
Figure 9C:
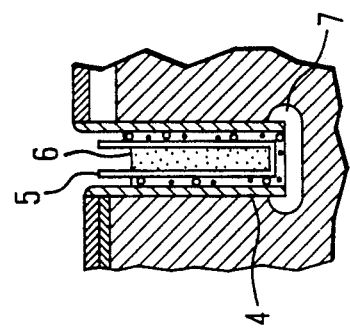
Figure 9H:
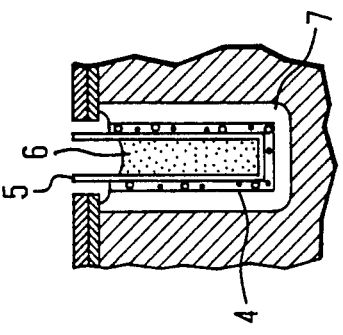
Figure 9B:
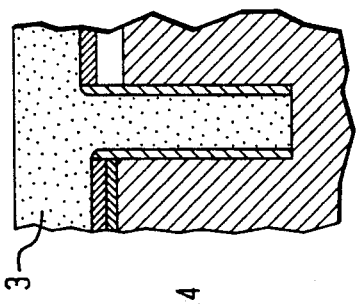
Figure 9G:
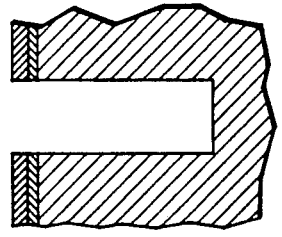
Figure 9A:
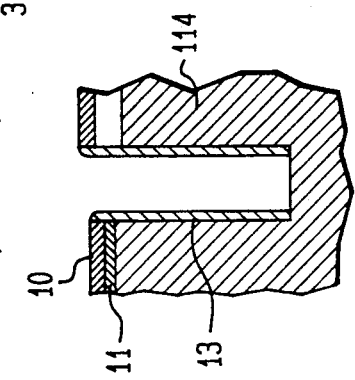
Figure 9F:
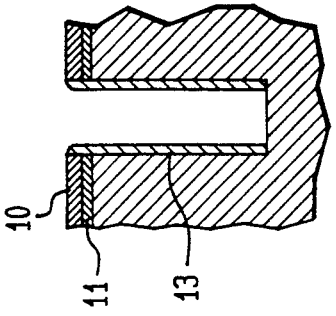

A cross sectional construction of the semiconductor memory device will be described with reference to FIG. 8. The semiconductor memory device includes a single crystalline semiconductor substrate 14 having a main surface 1, a plurality of silicon islands 52 functioning as active regions (only one silicon island 52 is shown in FIG. 8 for simplicity), and a trench 62 for isolating the silicon islands 52 from one another. The trench 62 has a width of 0.3 μm and a depth of 3.0 μm. The silicon island 52 has a top surface of 0.3 μm×1.7 μm.

The inner wall of the trench 62, namely, the side wall of the silicon island 52, is covered with an insulating layer 63. The insulating layer 63 which is located in the trench 62 is covered with a semiconductor layer 80.

The semiconductor layer 80 includes a first polycrystalline semiconductor layer 64 formed on the insulating layer 63 and a grown semiconductor film 81 covering the first polycrystalline semiconductor layer 64. A portion of the grown semiconductor film 81 which is in contact with the silicon island 52 is an epitaxial layer 68. A portion of the grown semiconductor film 81 which is not in contact with the silicon island 52 is a second polycrystalline semiconductor layer 67.

A MOS transistor of the semiconductor memory device according to the third example includes a source 55 and a drain 74 both formed in the silicon island 52, a gate insulating film formed on the silicon islands 52, and a gate electrode 59 (hereinafter, referred to as the "word line" 59) formed on the gate insulating film. The word line 59 is covered with an interlevel insulating film 75, and a bit line 60 is formed on the interlevel insulating film 75 so as to cross the word line 59.

Figure 6G:
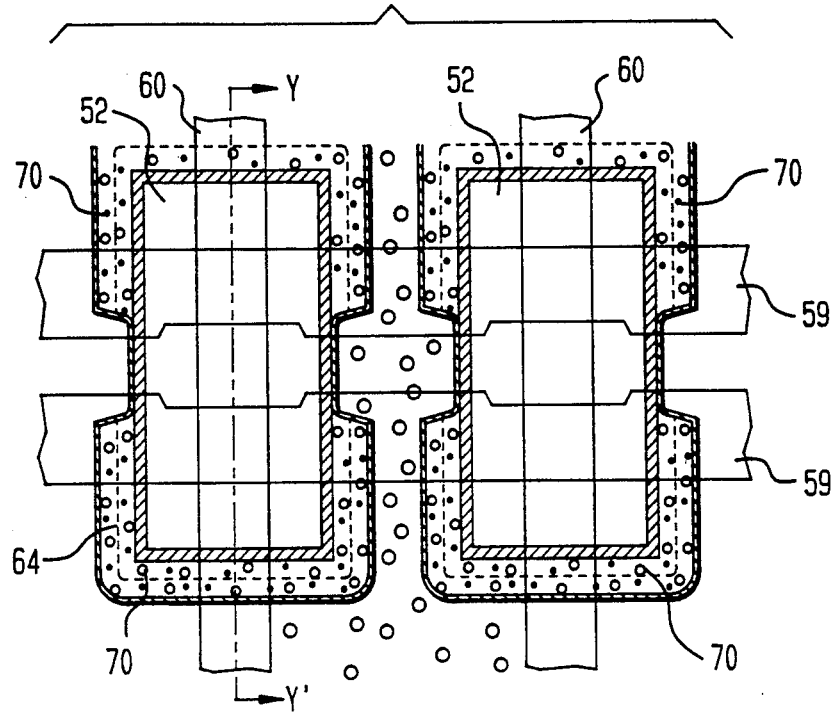

Referring to FIG. 6G, a plan construction of the semiconductor memory device of the third example will be described.

FIG. 6G shows two silicon islands 52. Each silicon island 52 has two MOS transistors. The source 55 of each MOS transistor is connected to one of storage nodes 70 which cover the side walls of the silicon islands 52 on which the MOS transistors are formed.

A method for manufacturing the semiconductor memory device according to the third example will be described with reference to FIGS 6A through 6F and 7A through 7F.

First, the trench 62 is formed in the single crystalline semiconductor substrate 14. By forming the trench 62 in a matrix, a plurality of silicon islands 52 are obtained. An oxide film 63 is formed on the inner wall of the trench 62, and then the first polycrystalline semiconductor layer 64 is deposited on the oxide film 63. As in the preceding examples, the trench 62 is filled with a resist 65 and an etchback process is used to leave the oxide film 63 and the first polycrystalline semiconductor layer 64 (P density: $2\times10^{20}$ cm$^{-3}$) only in the trench 62. The etching conditions are set so as to etch away the oxide film 63 and the first polycrystalline semiconductor layer 64 located within 100 to 200 nm below a top surface of the single crystalline semiconductor substrate 14. By such an etchback process, a portion 69 of the side wall of the silicon island 52 is exposed. In FIG. 6A, the resist 65 is omitted for simplicity.

After the resist 65 is removed, the first polycrystalline semiconductor layer 64 located on a bottom surface of the trench 62 is removed as is shown in FIG. 7B. As a result, the side wall of the silicon island 52, namely, the inner wall of the trench 62, is covered with the first polycrystalline semiconductor layer 64 which is separated into band-shaped pieces as is shown in FIG. 6B.

As is shown in FIGS. 6C and 7C, the second polycrystalline semiconductor layer 67 and the the single crystalline silicon (epitaxial) film 68 are respectively grown on the first polycrystalline semiconductor layer 64 and the exposed portion 69 of the side wall of the silicon island 52, both by the use of a selective LPCVD method. The second polycrystalline semiconductor layer 67 and the single crystalline silicon film 68 are deposited in the same conditions as in the selective LPCVD method used in the first and the second examples. Accordingly, no silicon film is deposited on a nitride film 66 on the silicon island 52 and the oxide film 63 on the bottom surface of the trench 62. The first and the second polycrystalline semiconductor layers 64 and 67 constitute the storage node 70 of a capacitor of the semiconductor memory device.

As is shown in FIG. 6D, the first and the second polycrystalline semiconductor layers 64 and 67 covering each side wall of the silicon island 52 are separated into two parts. In more detail, a resist pattern having openings which are indicated by broken lines in FIG. 6D is formed by the use of the known lithography technique, and then the specified portions of the first and the second polycrystalline semiconductor layers 64 and 67 are removed by the use of an isotropic dry etching technique. In this way, two storage nodes 70 are formed on one silicon island 52. Portions of the first and the second polycrystalline semiconductor layers 64 and 67 which are covered with the resist pattern are prevented from being removed by the dry etching as is shown in FIG. 7D. The above dry etching is conducted under over-etching conditions in order to prevent a current leak between the storage node 70 and the single crystalline semiconductor substrate 14 or between the storage node 70 and the drain 74 of the MOS transistor.

As is shown in FIGS. 6E and 7E, a capacitive insulating film 71 formed of an ONO film is formed to cover the single crystalline semiconductor substrate 14. Then, as is shown in FIGS. 6F and 7F, a phosphorus doped polysilicon film 72 is deposited on the capacitive insulating film 71. A portion of the phosphorus doped polysilicon film 72 which is located outside the trench 62 is removed by the use of the etchback technique, thereby leaving the phosphorus doped polysilicon film 72 only in the trench 62. After an oxide film 73 is formed on the phosphorus doped polysilicon film 72, a top surface of the silicon island 52 is exposed.

A known method for manufacturing a DRAM is used to obtain the semiconductor memory device shown in FIGS. 6G and 8. Practically, after the word line 59 is formed, the source 55 and the drain 74 are formed in the silicon island 52 by the use of an ion implantation technique. After the interlevel insulating film 75 is formed so as to cover the word line 59, the bit line 60 is formed on the interlevel insulating film 75. The bit line 60 is contacted on an area defined by two word lines 59 of each silicon island 52.

According to the third example, the storage node 70 and the source 55 have no native oxide film therebetween. Therefore, the electrical connection between the storage node 70 and the source 55 is satisfactory.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device including a single crystalline semiconductor substrate having a main surface, a plurality of active regions formed at the main surface, and an isolation region which is formed at the main surface and isolates the active regions from one another, wherein:

each of the active regions has a transistor region and a capacitor region;

the capacitor region has a trench formed in the single crystalline semiconductor substrate, an inner wall of the trench being covered with an insulating layer;

at least a portion of the transistor region and the insulating layer are both covered with a single continuous semiconductor layer;

a portion of the semiconductor layer, the portion covering at least the portion of the transistor region is an epitaxial layer; and a portion of the semiconductor layer, the portion covering the insulating layer, is a polycrystalline layer, which functions as a storage node of a capacitor.

2. A semiconductor memory device according to claim 1, wherein the polycrystalline layer comprises a first polycrystalline semiconductor layer formed on the insulating layer and a second semiconductor layer covering the first semiconductor layer, and the second semiconductor layer is a portion of a single continuous semiconductor layer which includes the epitaxial layer.

3. A semiconductor memory device according to claim 1, wherein the portion of the single continuous semiconductor layer which covers at least the portion of the transistor region has a channel of a transistor.

4. A semiconductor memory device according to claim 1, wherein the polycrystalline layer has at least two cylinders in the trench.

5. A semiconductor memory device including a single crystalline semiconductor substrate having a main surface, a plurality of island regions formed at the main surface, and a trench region which is formed in the main surface and isolates the island regions from one another, wherein:

each of the island regions has a side wall, a portion of which is exposed in a portion of the trench region, and a portion of the side wall which is not exposed is covered with an insulating layer, and each of the island regions has at least one transistor at a top surface thereof;

a portion of the side wall of each island region and the insulating layer are both covered with a single continuous semiconductor layer;

a portion of the semiconductor layer, the portion covering the portion of the side wall of each island region, is an epitaxial layer; and a portion of the semiconductor layer, the portion covering the insulating layer is a polycrystalline layer, which functions as a storage node of a capacitor.

* * * * *